324-77.    SR 01-11-72    XR    3,634,700

[11] 3,634,700

[72] Inventor Joseph A. Worcester
Frankfort, N.Y.
[21] Appl. No. 102,324
[22] Filed Dec. 29, 1970
[45] Patented Jan. 11, 1972
[73] Assignee General Electric Company

[54] BIDIRECTIONAL FREQUENCY SCAN SYSTEM
5 Claims, 2 Drawing Figs.

[52] U.S. Cl. .......... 307/233, 307/320, 324/77 CS, 325/422, 328/140, 331/4, 331/36 C
[51] Int. Cl. .......... H03b 3/08
[50] Field of Search .......... 307/233, 271, 320, 235; 328/140, 150, 138, 179; 324/78 R, 77 C, 77 CS; 331/4, 36 C; 325/318, 422

[56] References Cited
UNITED STATES PATENTS

| | | | |
|---|---|---|---|
| 2,924,783 | 2/1960 | Shapiro et al. | 331/4 |
| 2,977,466 | 3/1961 | Slater | 331/4 X |
| 3,029,339 | 4/1962 | Pan | 307/320 X |
| 3,147,448 | 9/1964 | Orlando | 331/4 |
| 3,293,571 | 12/1966 | Bott | 331/36 C X |
| 3,447,087 | 5/1969 | Takezaki et al. | 331/36 C X |
| 3,519,939 | 7/1970 | Tashima | 307/320 X |

*Primary Examiner*—Donald D. Forrer
*Assistant Examiner*—L. N. Anagnos
*Attorneys*—Marvin A. Goldenberg, W. J. Shanley, Jr., Frank L. Neuhauser, Oscar B. Waddell and Joseph B. Forman

ABSTRACT: A bidirectional frequency scan system in which a variable scan control voltage across a variable tuning reactance in the tuning circuitry is determined by the charge on a scan capacitor. Means are provided for selectively increasing or decreasing the charge on the scan capacitor so that when the capacitor is charging the system scans in one direction, and when the capacitor is discharging the system scans in the opposite direction.

INVENTOR:
JOSEPH A. WORCESTER,
BY [signature]
HIS ATTORNEY.

BIDIRECTIONAL FREQUENCY SCAN SYSTEM

BACKGROUND OF THE INVENTION

This invention relates to an automatic frequency scan system and more particularly to an automatic bidirectional frequency scan system for use in a radio receiver.

In radio receivers employing an automatic frequency scan system, the reactance of an element in the tuning circuit is varied so that the tuning circuit is tuned through a frequency band until a frequency is reached at which the signal strength of a received signal is above a certain threshold level. Early frequency scan systems employed motors or other mechanical means to drive a variable reactance in the tuning circuitry through its range of values. Variable capacitors or inductors were mechanically linked to the drive means.

More recent systems employ semiconductor devices called varactors as the variable reactance tuning means. A varactor is a reverse biased diode which is processed to have a high-junction capacitance and whose capacitance is an inverse function of the voltage appearing across the junction. In a tuned radio receiver employing varactors as a means for tuning over a given frequency band, means must be provided for varying the voltage across the varactors to effect tuning and likewise to initiate and continue the scan. When a signal having the requisite magnitude or signal strength is tuned in, the voltage across the varactors must be maintained to lock in the station. A customary approach for providing the varying scan control voltage is to connect a scan capacitor across the varactors. A scan is conducted by changing the charge and hence the voltage on this scan capacitor.

One of the disadvantages of such prior art systems in which varactors are used as the variable reactance tuning means is that the scan is unidirectional. That is, when the tuning circuit reaches one extreme end of its range within a given frequency band the tuning circuitry must be reset to its other extreme end, usually requiring additional circuit components. Moreover, it would be to the operator's advantage to have a scan system in which the scan could be initiated in either of two directions. The operator could then, at his discretion, start the scan in the direction in which it is most likely to encounter desired stations having the required signal strength. If the receiver was previously tuned to a station at the high end of the frequency band and the operator wished to tune to a station in the middle of the band he would initiate the scan in a downward direction and quickly encounter the station instead of starting the scan upwardly and waiting until the scan system reset itself and then scanned to the desired station, possibly passing through and stopping at a number of undesired stations, each stop requiring additional bothersome scan initiations.

SUMMARY OF THE INVENTION

It is therefore an object of this invention to provide an improved automatic frequency scan system.

It is another object of this invention to provide an improved automatic frequency scan system in which the need for the scan system to reset itself is eliminated.

It is a further object of this invention to provide an improved frequency scan system which is bidirectional.

Briefly stated, the above objects are attained in one form of the invention by employing a scan capacitor connected to a varactor tuning circuit for impressing a bidirectional variable scan control voltage across the varactors of said tuning circuit. A control transistor, whose collector and emitter circuit is connected in series with a charge source and in parallel with the scan capacitor, controls the voltage across the scan capacitor. A momentary contact, scan initiating switch is momentarily actuated into one of two positions to determine the state of conductivity of the control transistor. When the switch is in a first position, charge is taken from a second capacitor which is coupled to the base of said transistor, and the transistor is biased into a low-conductivity state. The scan capacitor is thus permitted to charge, thereby causing the voltage across the varactors to increase. The increasing voltage causes the capacitance of the tuning varactors to decrease and the tuning circuitry to scan upwardly in frequency. When the switch is in its second position, the second capacitor is charged, thereby increasing the voltage at the base of the control transistor, biasing it into a high-conductivity state. The scan capacitor consequently discharges, causing the voltage across the varactors to decrease and the tuning circuitry to scan downwardly in frequency. Frequency discriminator means, the output of which is coupled to the base of the control transistor, generates a signal whose polarity is determined by the direction of the frequency scan. The discriminator signal combines with the voltage on the second capacitor to maintain the transistor at a fixed conductivity state when a station having the required signal strength is received to lock in the station.

DESCRIPTION OF THE DRAWINGS

While the specification concludes with claims particularly pointing out and distinctly claiming the subject matter which is regarded as the invention, it is believed that the invention will be better understood from the following description taken in connection with the accompanying drawings in which:

DESCRIPTION OF THE PREFERRED EMBODIMENT

Figure 1:
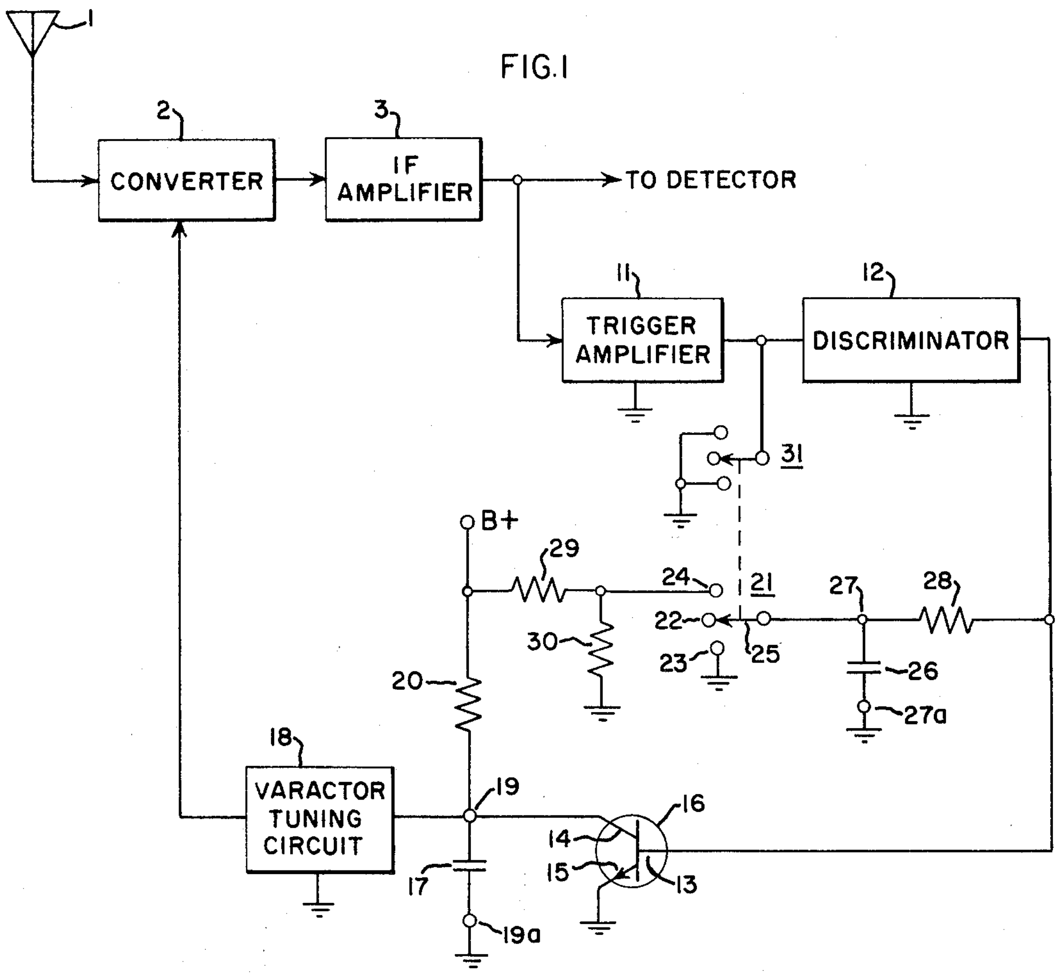
FIG. 1 is a schematic circuit diagram showing an improved bidirectional frequency scan circuit in accordance with the invention.
Figure 2:
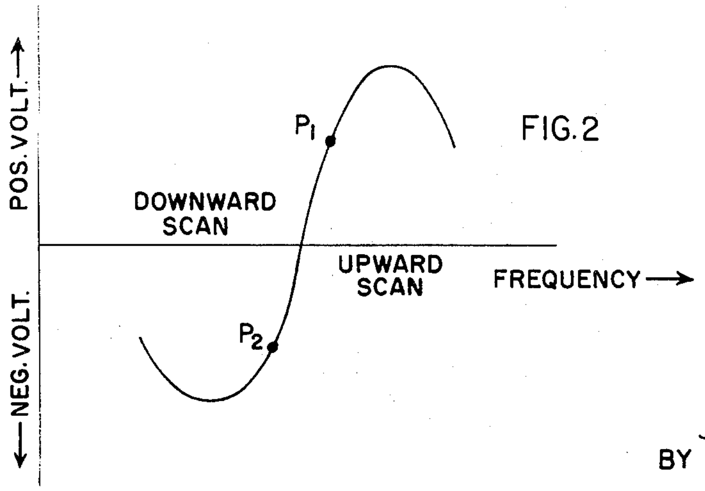
FIG. 2 is a graph of the characteristic of the frequency discriminator as employed in the improved bidirectional frequency scan circuit.

Referring to FIG. 1, an incoming radio signal is received by an antenna 1 of a radio receiver and coupled to a converter stage 2 of conventional construction, typically an autodyne converter, for tuning the incoming signal over a predetermined band of frequencies and converting it to an intermediate frequency signal. The output of stage 2 is coupled to an intermediate frequency amplifier stage 3, the output of which is conventionally connected to the detector circuit of the receiver, not shown. The output of amplifier stage 3 is further connected to a narrow band-pass trigger amplifier 11. The output of amplifier 11 is connected to a balanced frequency discriminator 12, which is part of the bidirectional frequency scan system of the present invention. As the radio receiver is scanned through its range of values and approaches a station, the trigger amplifier 11 produces a signal following the voltage frequency characteristic of the received signal that is above a predetermined threshold level. The frequency discriminator 12 provides an output whose polarity is determined by which side of resonance the scan is on. If the scan is upward, the output of the discriminator 12 is positive and if the scan is downward the output is negative, as shown in FIG. 2.

The output of the discriminator 12 is connected to the base 13 of a control transistor 16. The emitter 15 of the control transistor 16 is connected to a common reference potential, while the collector 14 is connected to one terminal 19 of a scan capacitor 17. The other terminal **19*a* of the scan capacitor 17 is coupled to the common reference potential. A positive biasing source B+, which supplies a charging current to the scan capacitor 17 to effect the scan, is connected to terminal 19 of the scan capacitor 17 by a resistor 20. The circuit including control transistor 16 and biasing source B+ comprises variable conduction means for establishing charge on scan capacitor 17. Terminal 19 of scan capacitor 17 is connected to the input of a varactor tuning circuit 18, the output of which is coupled to the converter 2 for scanning of the received signal. The varactor tuning circuit 18 may include one or more varactor diodes across which is applied the voltage from capacitor 17**.

A three-position switch 21, having a movable contact arm 25, first and second momentary contact positions 23 and 24 and rest contact position 22, is provided to initiate the scan.

The contact arm 25 is connected to one terminal 27 of a second capacitor 26. The other terminal 27a of capacitor 26 is connected to the common reference potential. Terminal 27 is connected by a resistor 28 to the base 13 of control transistor 16. First contact position 23 of switch 21 is coupled to the common reference potential to discharge capacitor 26 with contact arm 25 in that position. Second contact position 24 is connected through a resistor 29 to the positive biasing source B+ and through a resistor 30 to the common reference potential so as to charge capacitor 26 when contact arm 25 is moved to contact position 24.

OPERATION

When it is desired to release a station of given frequency and scan toward higher frequencies, the contact arm 25 of the scan-initiating switch 21 is momentarily moved to its first contact position 23 and then returned to contact position 22. With contact arm 25 momentarily at contact position 23, capacitor 26 immediately discharges through contact arm 25 to the common reference potential, dissipating any charge that may have accumulated when the receiver was previously tuned to a station. In addition to removing any voltage from capacitor 26, the discriminator output must also be eliminated. This can be done, in one way, by simply shorting the output of the trigger amplifier 11 to the common reference potential when the contact arm 25 is displaced to contact position 23. A switch 31 ganged to switch 21 is provided for this purpose. Since there is no output from the discriminator nor any from capacitor 26, there is no voltage applied to the base 13 of the control transistor 16. Control transistor 16 is consequently biased into a low-conductivity state permitting scan capacitor 17 to charge from the positive biasing source B+ through resistor 20. Consequently, an increasing positive scan control voltage is applied to the varactor tuning circuit 18, causing the tuning circuitry to scan toward the higher frequencies within a given frequency band.

As a station having a signal strength above the threshold level of the trigger amplifier is neared, the trigger amplifier will produce an output. Contact arm 25 has previously been returned to contact position 22 and the short removed from the trigger amplifier output. Since the scan is proceeding upwardly, the discriminator output will be positive as shown in FIG. 2. As the scan continues, an increasing positive voltage is applied to the base 13 of control transistor 16 thereby causing its conductivity to rise. Since control transistor 16 is shunted across the scan capacitor 17, an increase in its conductivity will drain some current from the scan capacitor 17. Some point P1 on the signal characteristic will be reached where the collector-emitter resistance of the control transistor, interacting with the resistor 20 to form a voltage divider, will reach an equilibrium value and impress a constant scan control voltage across the capacitor 17 to lock in the station.

Point P1 is the only stable operating point for an upward scan to a given station. Should, hypothetically, the system settle at a point higher on the characteristic curve, an increased voltage will be applied to the base 13 of control transistor 16. Its conductivity will be too high and the scan capacitor 17 will begin to discharge reducing the scan control voltage applied to the varactor tuning circuit 18. The frequency of the received signal will decrease until stable point P1 is reached. Likewise should the system settle at some point lower on the characteristic curve, the consequently reduced control transistor conductivity will cause the scan capacitor to charge, increasing the frequency of the received signal and thereby causing the system to settle once again at point P1.

It should be noted that since trigger amplifier 11 has a narrow band pass, preferably in the order of 200 to 500 Hz., tuning the receiver to some point P1 below resonance will have negligible effect on the fidelity of the receiver.

In addition to scanning upwardly upon actuation of scan initiating switch 21 the receiver will begin an upward scan as soon as the receiver is turned on. The bias voltage B+ will be applied directly to the scan capacitor 17 causing it to charge and impress an increasing scan control voltage across the varactor tuning circuit 18.

To scan downward in frequency from some previously tuned station, contact arm 25 of switch 21 is momentarily displaced to the second contact position 24, connecting the biasing source B+ through the resistor 29 to terminal 27 of capacitor 26, thereby charging it. As previously described, the frequency discriminator output must be removed, e.g., by switch 31 shorting the trigger amplifier 11 to the common reference potential. The voltage developed across capacitor 26 is applied through resistor 28 to the base 13 of control transistor 16, biasing it into a high-conductivity state. Scan capacitor 17, which was charged to some level when the receiver was previously tuned to a station begins to discharge through control transistor 16, applying a decreasing positive scan control voltage to the varactor tuning circuit 18. The decreasing scan control voltage causes the tuning circuit to scan downwardly in frequency.

As a station having the requisite signal strength is approached the threshold level of trigger amplifier 11 is exceeded. Since the scan is proceeding downwardly the discriminator 12 will provide a negative output as shown in FIG. 2. The negative discriminator output will interact with the positive voltage being supplied by capacitor 26 to the base 13 of control transistor 16 to reduce the conductivity of the control transistor. There will be some point $P_2$ on the discriminator output at which the conductivity of the control transistor will be such that the system will equilibrate. $P_2$ is the only stable operating point for a downward scan to a given received station. Should the system for some reason settle lower on the characteristic an excessively negative voltage would be applied to the control transistor, decreasing its conductivity too much and causing the scan capacitor 17 to charge, thereby raising the frequency of the received signal until point $P_2$ is reached. Likewise should the system settle higher on the characteristic the negative voltage from the discriminator supplied to the control transistor will be too low and the conductivity of the control transistor will be too high causing the scan capacitor 17 to discharge slightly, reducing the frequency of the received signal until point $P_2$ is again reached.

After a short time capacitor 26 discharges through the control transistor 16, thereby removing the positive bias from the base electrode 13. The conductivity of the control transistor will be greatly reduced causing the scan capacitor 17 to charge. The tuning circuitry will consequently increase the frequency of the received signal by a small amount, causing it to move from point $P_2$ of FIG. 2 to equilibrate at $P_1$, as was previously described.

While a specific embodiment of this invention has been shown and described, other embodiments may be made without departing from the spirit and scope thereof. For example, the trigger amplifier 11 and discriminator 12 could be combined into a single discriminator component possessing the requisite narrowband and threshold characteristics.

I claim:

1. A bidirectional frequency scan system for selectively scanning through a frequency band in one of two directions and stopping when a received signal having an amplitude above a predetermined level is encountered, comprising:
   a. storage means for developing a bidirectional scan control voltage,
   b. variable conduction means for increasing the voltage of said storage means to provide scanning in one direction, and for decreasing the voltage of said storage means to provide scanning in the opposite direction, and
   c. control means responsive to said received signal for controlling the operation of said variable conduction means so as to provide scanning in either of said two directions and for fixing the level of said scan control voltage upon the amplitude of said received signal exceeding said predetermined level.

2. A scan system as in claim 1 wherein said control means includes:

a. bias voltage means,
b. circuit means responsive to the amplitude of the received signal and to the direction of the scan, and
c. means for applying the combined outputs from said bias voltage means and said circuit means to said variable conduction means.

3. A scan system as in claim 2 wherein said storage means includes a first capacitor and said variable conduction means comprises:

a. a voltage source coupled in series with said capacitor for providing charge thereto, and
b. a control transistor coupled in parallel with said capacitor, the conduction of said transistor being responsive to said control means for regulating the amount of charge on said capacitor.

4. A scan system as in claim 3 wherein said bias voltage means comprises:

a. a second capacitor, and
b. switching means for selectively coupling first and second voltage levels across said second capacitor, said first voltage level having a value for inhibiting conduction of said transistor so as to permit said first capacitor to charge, said second voltage level having a value for producing high conduction of said transistor so as to permit said first capacitor to discharge.

5. A scan system as in claim 4 wherein said circuit means includes a discriminator for generating a bipolar output, one polarity of said output combining with said first voltage level to establish an equilibrium condition within said variable conduction means, and the other polarity of said output combining with said second voltage level to establish said equilibrium condition.

* * * * *